(12) United States Patent
Tang et al.

(10) Patent No.: US 11,508,809 B2
(45) Date of Patent: Nov. 22, 2022

(54) SEMICONDUCTOR DEVICE AND PREPARATION METHOD THEREOF

(71) Applicant: Institute of Microelectronics, Chinese Academy of Sciences, Beijing (CN)

(72) Inventors: Yidan Tang, Beijing (CN); Xinyu Liu, Beijing (CN); Yun Bai, Beijing (CN); Shengxu Dong, Beijing (CN); Chengyue Yang, Beijing (CN)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 173 days.

(21) Appl. No.: 17/041,393

(22) PCT Filed: Sep. 12, 2018

(86) PCT No.: PCT/CN2018/105266
§ 371 (c)(1),
(2) Date: Sep. 24, 2020

(87) PCT Pub. No.: WO2020/051806
PCT Pub. Date: Mar. 19, 2020

(65) Prior Publication Data
US 2021/0074807 A1    Mar. 11, 2021

(51) Int. Cl.
*H01L 29/06* (2006.01)
*H01L 29/47* (2006.01)
(Continued)

(52) U.S. Cl.
CPC ........ *H01L 29/0619* (2013.01); *H01L 29/401* (2013.01); *H01L 29/456* (2013.01); *H01L 29/47* (2013.01); *H01L 29/872* (2013.01)

(58) Field of Classification Search
CPC . H01L 29/0619; H01L 29/401; H01L 29/456; H01L 29/47; H01L 29/872;
(Continued)

(56) References Cited

U.S. PATENT DOCUMENTS

| 9,368,650 | B1* | 6/2016 | Yen ..................... H01L 29/0688 |
| 2002/0125482 | A1* | 9/2002 | Friedrichs .......... H01L 29/1608 |
| | | | 257/E29.104 |

(Continued)

FOREIGN PATENT DOCUMENTS

| CN | 107331616 A | 11/2017 | |
| CN | 108346688 A | * 7/2018 | ......... H01L 29/0619 |
| CN | 108346688 A | 7/2018 | |

OTHER PUBLICATIONS

International Search Report and Written Opinion dated May 29, 2019, issued in International Patent Application No. PCT/CN2018/105266, filed Sep. 12, 2018, 9 pages.

*Primary Examiner* — Shahed Ahmed
*Assistant Examiner* — Khatib A Rahman
(74) *Attorney, Agent, or Firm* — Davis Wright Tremaine LLP; Michael J. Donohue

(57) ABSTRACT

The present disclosure discloses a semiconductor device and a preparation method thereof. The semiconductor device includes: an N+ substrate, a plurality of openings opening toward a back surface formed in the N+ substrate; an N− epitaxial layer formed on the N+ substrate, the N− epitaxial layer including: an active area epitaxial layer including a plurality of P++ area rings and a plurality of groove structures, wherein single groove structure is formed on single P++ area ring; a terminal area epitaxial layer including an N+ field stop ring and a plurality of P+ guard rings; a Schottky contact formed on the active area epitaxial layer, a passivation layer formed on the terminal area epitaxial layer, and ohmic contacts formed on the back surface of the N+ substrate and in the plurality of openings.

11 Claims, 8 Drawing Sheets

(51) Int. Cl.
*H01L 29/872* (2006.01)
*H01L 29/40* (2006.01)
*H01L 29/45* (2006.01)

(58) Field of Classification Search
CPC ............ H01L 29/6606; H01L 29/0638; H01L 29/417; H01L 29/1608
See application file for complete search history.

(56) References Cited

U.S. PATENT DOCUMENTS

2007/0215938 A1* 9/2007 Yanagida ............ H01L 29/7398
257/E29.198
2009/0315071 A1* 12/2009 Iwabuchi ............ H01L 29/0653
257/E29.183
2019/0140046 A1* 5/2019 Liu ...................... H01L 29/267

* cited by examiner

SEMICONDUCTOR DEVICE AND PREPARATION METHOD THEREOF

CROSS-REFERENCE TO RELATED APPLICATION

This application is a Section 371 National Stage Patent Application of International Application No. PCT/CN2018/105266, filed on Sep. 12, 2018, entitled "SEMICONDUCTOR DEVICE AND PREPARATION METHOD THEREOF".

TECHNICAL FIELD

Embodiments of the present disclosure relate to the field of semiconductor technology, and in particular to a trench device and a preparation method thereof.

BACKGROUND

Trench devices play an important role in the semiconductor field with their high integration and excellent performance. For example, the trench junction barrier Schottky diode (TJBS) utilizes a trench structure to push the pn junction barrier further into the device based on the junction barrier Schottky structure (JBS), so as to fully reduce the Schottky barrier reduction effect on a surface of the device under high reverse blocking voltage, and eliminate the restriction of reverse leakage current on the maximum blocking voltage. However, with the introduction of the trench structure, a length of a conductive channel of the TJBS is longer than that of the JBS, thereby increasing the forward resistance and reducing the forward current under the forward voltage. As a result, the conventional trench device introduces a defect that the forward on-resistance becomes larger while improving the reverse blocking capability.

In trench devices, the substrate resistance accounts for a large proportion of the entire on-resistance, for example, the substrate resistance accounts for up to 50% in a 1200V SiC TJBS device. Therefore, optimizing the substrate resistance is a necessary means to improve the forward conduction capability of the device. In the related art, the substrate thinning technology is mainly used to optimize the substrate resistance. However, when the substrate is thinned to 100 µm, unevenness and stress imbalance may occur, as a result, it is difficult to employ photolithography, etching, oxidation and other methods to perform fine processes on the front side of the device. Thus, the trench device with a thinner substrate requires a process which is completely different from the conventional device, thereby increasing the complexity and difficulty of production.

Therefore, it is necessary to study a trench device with low on-resistance and simple process.

SUMMARY

According to one aspect of the present disclosure, a semiconductor device is provided, comprising: an N+ substrate, in which a plurality of openings opening toward a back surface are formed; an N− epitaxial layer on the N+ substrate, the N− epitaxial layer comprising an active area epitaxial layer and a terminal area epitaxial layer; a Schottky contact on the active area epitaxial layer; a passivation layer on the terminal area epitaxial layer; and ohmic contacts on the back surface of the N+ substrate and in the plurality of openings, wherein the active area epitaxial layer comprises a plurality of P++ area rings and a plurality of groove structures, single groove structure is formed on single P++ area ring, and the terminal area epitaxial layer comprises an N+ field stop ring and a plurality of P+ guard rings.

According to some embodiments, the N+ substrate comprises an active area substrate and a terminal area substrate, and the plurality of openings are formed in both the active area substrate and the terminal area substrate.

According to some embodiments, the N+ substrate comprises an active area substrate and a terminal area substrate, and the plurality of openings are formed only in the active area substrate.

According to some embodiments, the openings in the active area substrate and the groove structures are arranged in a staggered arrangement.

According to some embodiments, the openings in the terminal area substrate are arranged corresponding to the P+ guard rings.

According to some embodiments, the depth of each of the openings is greater than, equal to, or less than the thickness of the N+ substrate.

According to some embodiments, single groove structure has a width of 1-8 µm, a depth of 0.5-1 µm, and a spacing between adjacent groove structures is in a range of 1-10 µm.

According to some embodiments, single P+ guard ring has a width of 1-5 µm, a depth of 0.5-1 µm, and a spacing between adjacent P+ guard rings is in a range of 1-5 µm.

According to some embodiments, the material of the Schottky contact comprises Mo, Al or a metal having a lower barrier than Mo and Al.

According to some embodiments, the semiconductor device comprises a SiC trench device.

According to another aspect of the present disclosure, a method of preparing a semiconductor device is provided, comprising: providing an N+ substrate; forming an N− epitaxial layer on the N+ substrate, wherein the N− epitaxial layer comprises an active area epitaxial layer and a terminal area epitaxial layer, and a plurality of groove structures are formed in the active area epitaxial layer; forming a plurality of P++ area rings in an area of the active area epitaxial layer below the plurality of groove structures, so that single P++ area ring is formed below single groove structure; forming an N+ field stop ring and a plurality of P+ guard rings on the terminal area epitaxial layer; forming a plurality of openings opening toward a back surface in the N+ substrate; forming ohmic contacts on the back surface of the N+ substrate and in the plurality of openings; and forming a passivation layer on the terminal area epitaxial layer, and forming a Schottky contact on the active area epitaxial layer.

According to some embodiments, the N+ substrate comprises an active area substrate, and positions of the openings in the active area substrate are determined by the groove structures.

According to some embodiments, the N+ substrate comprises a terminal area substrate, and positions of the openings in the terminal area substrate are determined by the P+ guard rings.

According to some embodiments, the Schottky contact is formed by a thermal annealing process, and the temperature of the thermal annealing process is 400-900° C. and the time of the thermal annealing process is 2-30 min.

BRIEF DESCRIPTION OF THE DRAWINGS

Through the following description of the present disclosure with reference to accompanying drawings, other objectives and advantages of the present disclosure will be obvious, and they may facilitate a comprehensive understanding of the present disclosure.

FIGS. 1-11 show a schematic diagram of a preparation process of a semiconductor device according to an exemplary embodiment of the present disclosure, wherein FIG. 11 shows a schematic structural view of the semiconductor device;

DETAILED DESCRIPTION OF EMBODIMENTS

Figure 1:
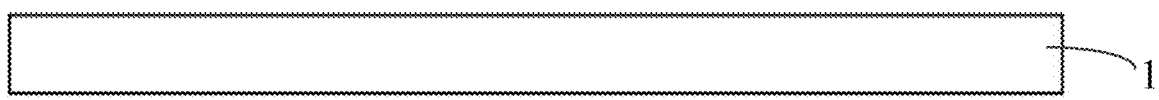

In order to make the objectives, technical solutions and advantages of the present disclosure clearer, the present disclosure will be further described in detail below in conjunction with specific embodiments and with reference to the accompanying drawings. It should be noted that, in the drawings or description of the specification, similar or identical parts use the same reference numerals. The implementations not shown or described in the drawings may be implemented in forms which are known to those of ordinary skill in the art. In addition, although this disclosure may provide an example of a parameter containing a specific value, it should be understood that the parameter does not need to be exactly equal to the corresponding value, but may be approximate to the corresponding value within acceptable error tolerances or design constraints. The directional terms mentioned in the embodiments, such as "up", "down", "front", "rear", "left", "right", etc., are only directions with reference to the drawings. Therefore, the directional terms used herein are used to illustrate and not to limit the protection scope of the present disclosure.

Figure 11:
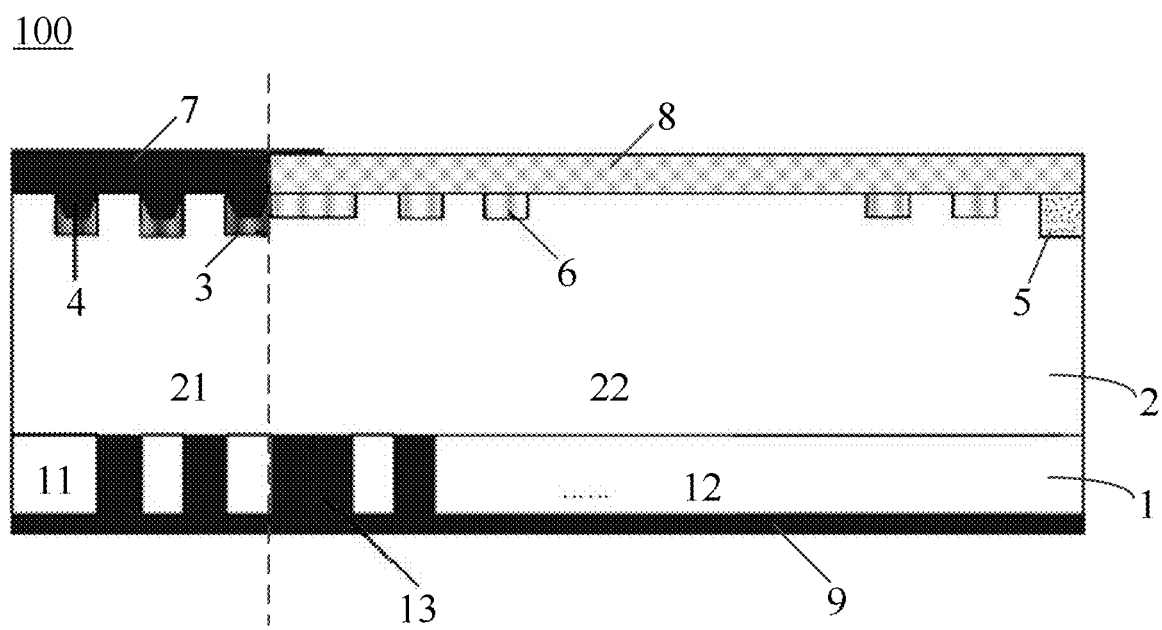

FIG. 11 shows a schematic structural diagram of a semiconductor device 100 according to an exemplary embodiment of the present disclosure. As shown in FIG. 11, the semiconductor device 100 includes: an $N^+$ substrate 1, a plurality of openings 13 which are opened toward a back surface and formed in the $N^+$ substrate 1; $N^-$ epitaxial layer 2 formed on the $N^+$ substrate, the $N^-$ epitaxial layer 2 including an active area epitaxial layer 21 and a terminal area epitaxial layer 22, the active area epitaxial layer 21 including a plurality of $P^{++}$ area rings 3 and a plurality of groove structure 4, wherein a single groove structure 4 is formed in one $P^{++}$ area ring 3, and the terminal area epitaxial layer 22 includes an $N^+$ field stop ring 5 and a plurality of $P^+$ guard rings 6; a Schottky contact 7 formed on the active area epitaxial layer 21; a passivation layer 8 formed on the terminal area epitaxial layer 22; and an ohmic contact 9 formed on the back surface of the $N^+$ substrate 1 and in the plurality of openings 13. In the semiconductor device 100 according to the embodiment of the present disclosure, by forming a plurality of openings in the $N^+$ substrate, the substrate resistance may be greatly reduced, thereby reducing the conduction loss of the device. At the same time, both the plurality of $P^{++}$ area rings and the plurality of groove structures are provided in the active area epitaxial layer, so that the surface electric field of the device may be reduced, the reduction effect of the Schottky barrier may be reduced, the leakage current may be suppressed, and the temperature dependence and sensitivity of the electrical characteristics of the device may be reduced. In addition, the semiconductor device of the present disclosure may be prepared by a front process, thereby obtaining a simple process and a good repeatability.

In the embodiment of the present disclosure, the semiconductor device 100 is a trench device, for example, a trench junction barrier Schottky diode (TJBS). In addition, it may also be trench insulated gate bipolar transistor (Trench-IGBT) or trench metal-oxide-semiconductor field effect transistor (Trench-MOSFET). In terms of materials, the semiconductor device 100 may be a SiC trench device. Silicon carbide material has excellent physical and electrical properties. The Silicon carbide material has unique advantages such as wide band gap, high thermal conductivity, large saturation drift speed and high critical breakdown electric field, so that it becomes an ideal material for making high-power, high-frequency, high-temperature resistant, and anti-radiation devices, and it has broad application prospects in military and civil affairs. Power electronic devices made of SiC materials have become one of the current hot devices and frontier research fields in the semiconductor field. In the embodiment of the present disclosure, $N^+$ substrate 1, $N^-$ epitaxial layer 2, $P^{++}$ area ring 3, $N^+$ field stop ring 5, and $P^+$ guard ring 6 all include doped SiC material.

It should be noted that N and P indicate the type of doping, and "++", "+" and "−" indicate the doping concentration, and the doping concentration decreases sequentially in that order. For example, "$N^-$" means lightly doped with N-type dopants, and the doping concentration of "$P^{++}$" is greater than that of "$P^+$". In the embodiment of the present disclosure, the doping concentration of the $N^+$ substrate 1 may be $10^{18} \sim 10^{19}$ cm$^{-3}$; the doping concentration of the $N^-$ epitaxial layer 2 may be $5 \times 10^{15}$ cm$^{-3} \sim 2 \times 10^{16}$ cm$^{-3}$, preferably $1 \times 10^{16}$ cm$^{-3}$, and the thickness of $N^-$ epitaxial layer 2 may be 5~100 μm, preferably 11 μm; the doping concentration of the $P^{++}$ area ring 3 may be $2 \times 10^{19}$ cm$^{-3}$; and the doping concentration of the plurality of $P^+$ guard rings 6 may be $8 \times 10^{18}$ cm$^{-3}$.

The material of the Schottky contact 7 may include Mo, Al, or a metal with a lower barrier than Mo and Al, and a metal with a lower barrier may be flexibly selected as the Schottky contact. In this way, the forward conductive capacity of the device may be greatly improved without increasing the reverse leakage current. The material of the ohmic contact 9 may include Ni metal. The material of the passivation layer 8 may be $SiO_2$.

With continued reference to FIG. 11, the $N^+$ substrate 1 may include an active area substrate 11 and a terminal area substrate 12. In the embodiment of the present disclosure, the active area epitaxial layer 21 and the active area substrate 11 respectively represent areas where the $N^-$ epitaxial layer 2 and the $N^+$ substrate 1 are located in the active area of the device; the terminal area epitaxial layer 22 and the terminal area substrate 12 respectively represent areas where the $N^-$ epitaxial layer 2 and the $N^+$ substrate 1 are located in the terminal area of the device. The dashed line in FIG. 11 divides the active area and terminal area of the semiconductor device 100. The active area is connected in parallel with PN junctions via Schottky contacts. The terminal area includes a guard ring as a terminal protection structure of the device.

In some embodiments, the active area substrate 11 and the terminal area substrate 12 are each formed with a plurality of openings 13. In other embodiments, the plurality of openings 13 are only formed in the active area substrate 11 of the semiconductor device 100, and no openings are provided in the terminal area substrate 12. According to FIG. 11, the plurality of openings 13 in the active area substrate 11 and the plurality of groove structures 4 in the active area epitaxial layer 21 are arranged in a staggered arrangement. That is, the openings are in a positional correspondence to spacings between adjacent groove structures, respectively, and spacings between adjacent openings are in a positional correspondence to the groove structures, respectively. Positions of the plurality of openings 13 in the active area substrate 11 may be determined by the plurality of groove structures 4. Thus, the width of the opening in the active area substrate 11 is consistent with the spacing between adjacent groove structures, and the spacing between adjacent openings is consistent with the width of single groove structure. In the embodiment of the present disclosure, the width of single groove structure may be 1-8 μm, the depth thereof may be 0.5-1 μm, and the spacing between adjacent groove structures may be 1-10 μm. The spacing and width of the plurality of openings 13 in the active area substrate 11 may be determined according to the width and spacing of the groove structures 4. In the embodiments of the present disclosure, the plurality of openings 13 in the active area substrate 11 and the plurality of groove structures 4 in the active area epitaxial layer 21 are arranged in a staggered arrangement. In this way, the on-resistance (mainly the drift layer resistance) may be effectively reduced, and in the forward on-state, the conduction path may be shortened and the current congestion effect may be alleviated. In addition, a premature breakdown when the reverse breakdown is exhausted may be avoided, and the reverse breakdown characteristics may be maintained to the greatest extent, that is, the reverse characteristics will not be affected with obtaining the optimal forward characteristics.

Further, the plurality of openings 13 in the terminal area substrate 12 are arranged correspondingly to the plurality of $P^+$ guard rings 6 in the terminal area epitaxial layer 22. That is, the plurality of openings 13 are in a positional correspondence to the plurality of $P^+$ guard rings 6, respectively, and spacings between adjacent openings 13 are in a positional correspondence to spacings between adjacent $P^+$ guard rings 6. Positions of the openings 13 in the terminal area substrate 12 may be determined by the plurality of $P^+$ guard rings 6. Therefore, the width of the opening in the terminal area substrate 12 is consistent with the width of the $P^+$ guard ring, and spacing between adjacent openings is consistent with spacing between adjacent $P^+$ guard rings. In the embodiment of the present disclosure, the width of a single $P^+$ guard ring may be 1-5 μm, the depth thereof may be 0.5-1 μm, and the spacing between adjacent $P^+$ guard rings may be 1-5 μm. The width and spacing of the plurality of openings 13 in the terminal area substrate 12 may be determined according to the width and spacing of the $P^+$ guard ring 6. In the embodiments of the present disclosure, the plurality of openings 13 in the terminal area substrate 12 are arranged correspondingly to the plurality of $P^+$ guard rings 6 in the terminal area epitaxial layer 22, respectively, so that it is beneficial to optimize the reverse breakdown characteristics. The openings 13 in the terminal area substrate 12 are equivalent to a plurality of etched "JTE" pillars formed in the substrate, so that they may realize an isolation effect similar to the field stop area. Moreover, adverse effects generated at the initial stage of device conduction may be alleviated, thereby facilitating device conduction.

The depth of each of the plurality of openings 13 may be greater than, equal to, or less than the thickness of the $N^+$ substrate 1. That is, the openings 13 may penetrate the substrate and extend to the $N^-$ epitaxial layer 2. Optionally, the opening 13 may have a through hole structure with a hole depth equivalent to the thickness of the $N^+$ substrate 1, or the opening 13 may have a blind hole structure which has a hole depth less than the thickness of the $N^+$ substrate 1 and is opened toward the back surface.

The number and depth of the openings 13 may be determined according to actual conditions. The $N^+$ substrate 1 has a structure including the plurality of openings 13, so that the substrate resistance may be reduced while ensuring a certain strength of the substrate. Thus, the feasibility and simplicity of device preparation may be ensured, and the device conduction loss may be effectively reduced.

FIGS. 1-11 show a schematic diagram of a preparation process of a semiconductor device 100 according to an exemplary embodiment of the present disclosure. Referring to FIGS. 1-11, the semiconductor device 100 may be prepared as follows.

Figure 2:
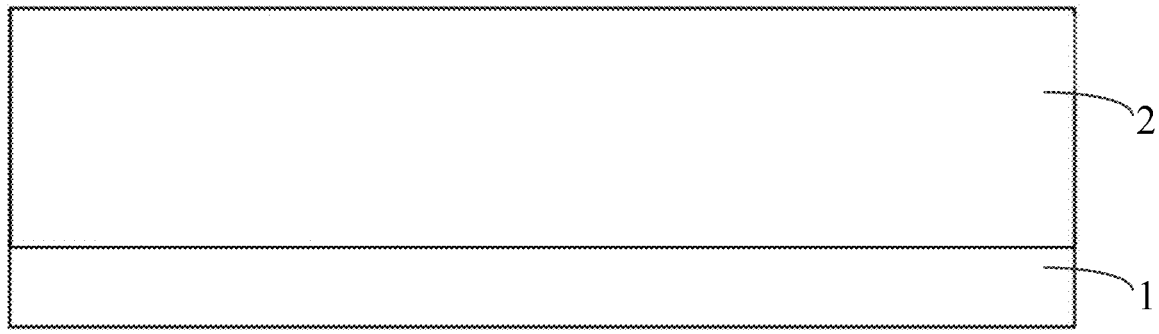
Figure 3:
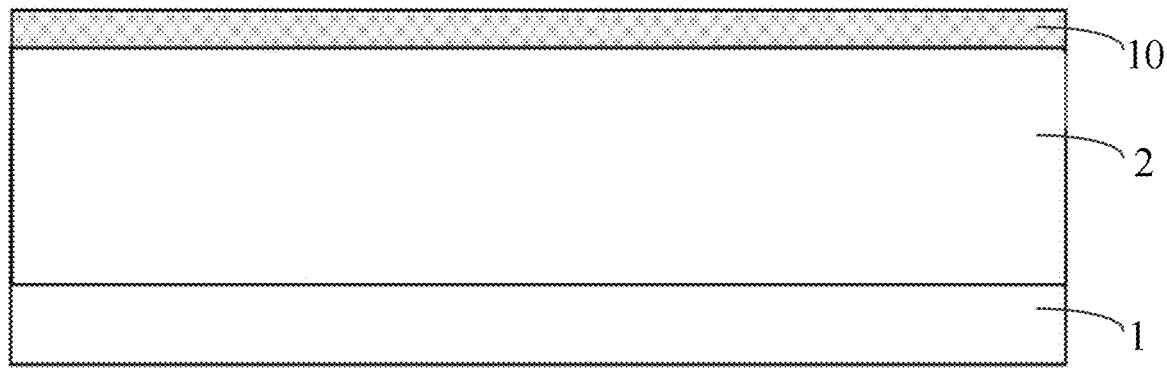
Figure 4:
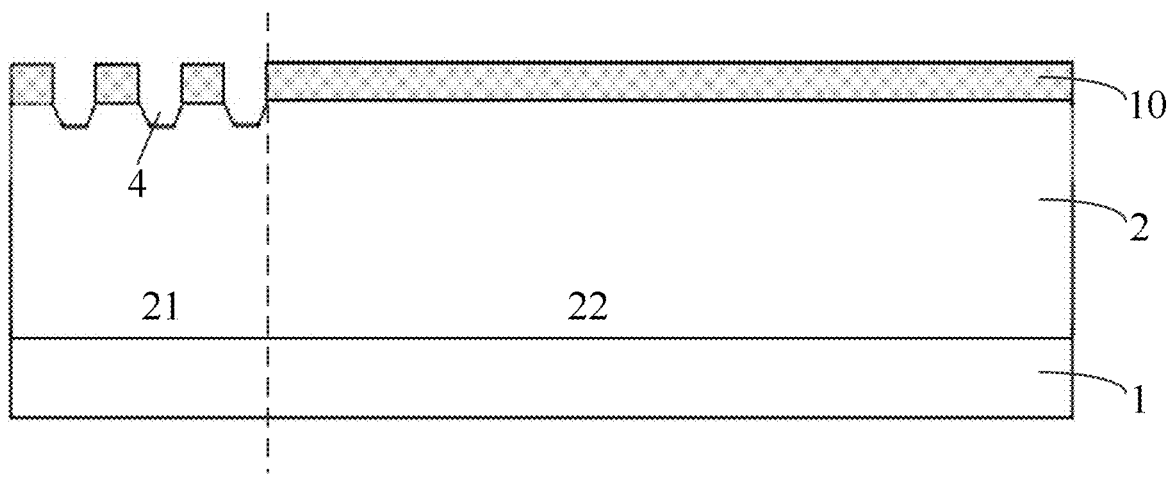
Figure 5:
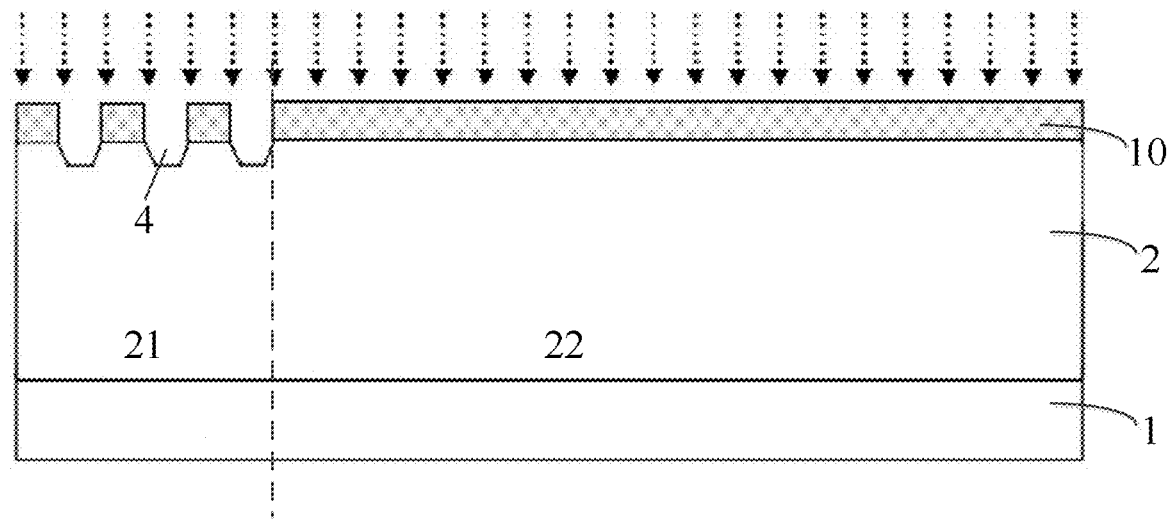
Figure 6:
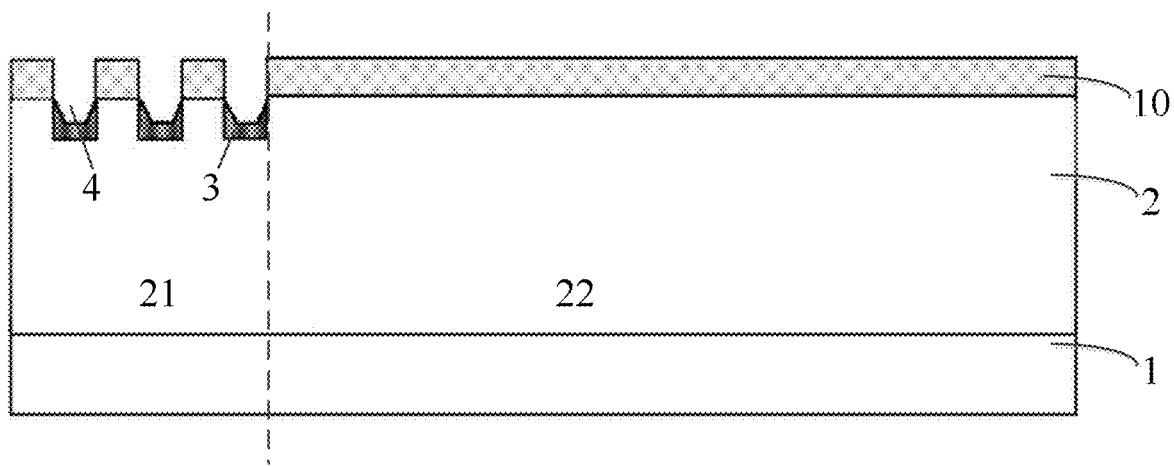
Figure 7:
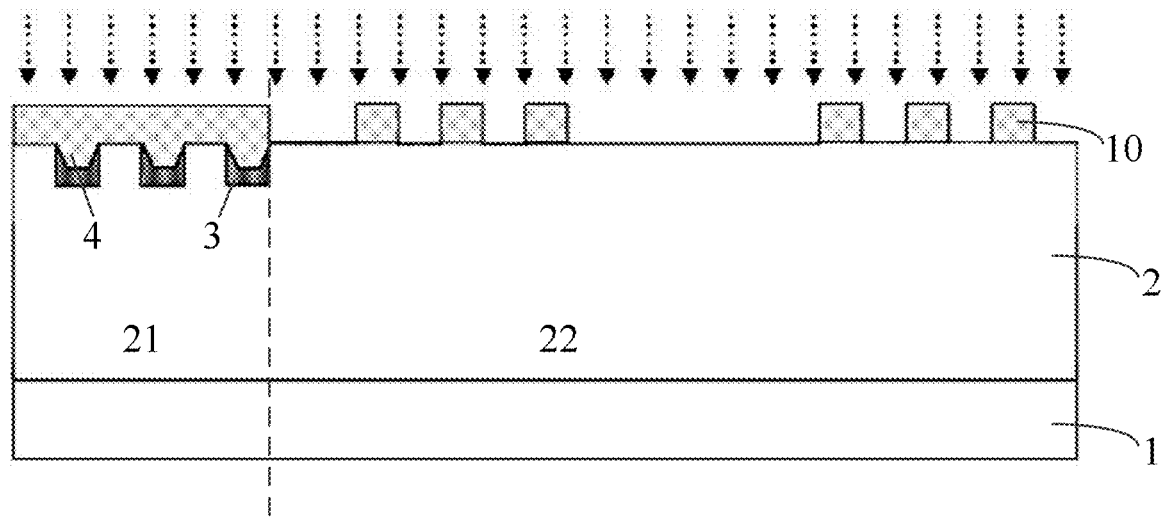
Figure 8:
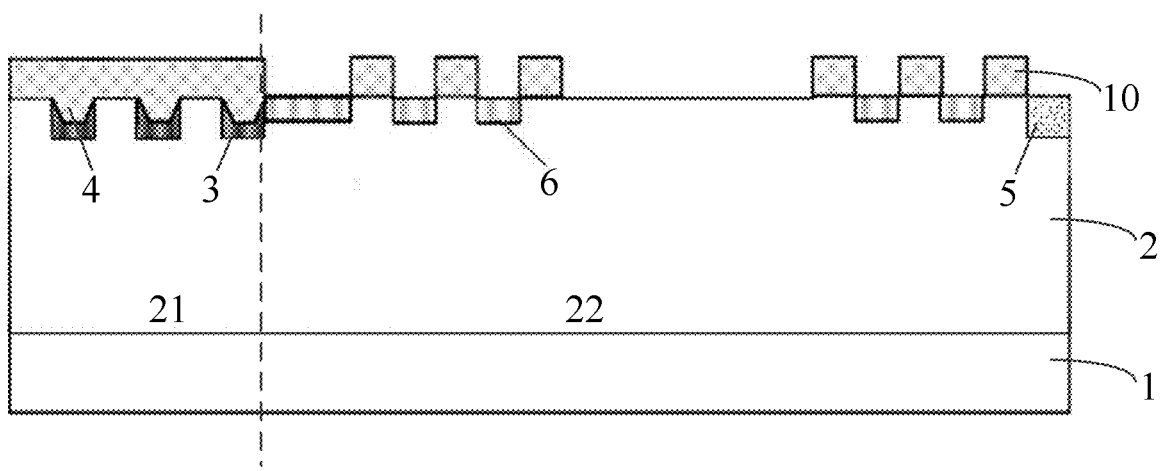
Figure 9:
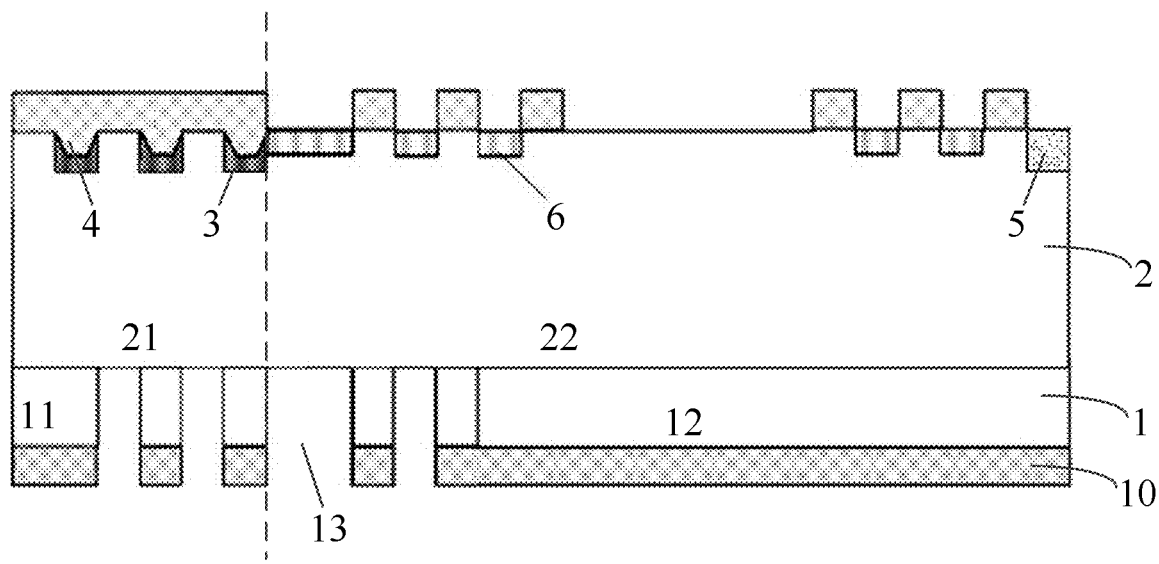
Figure 10:
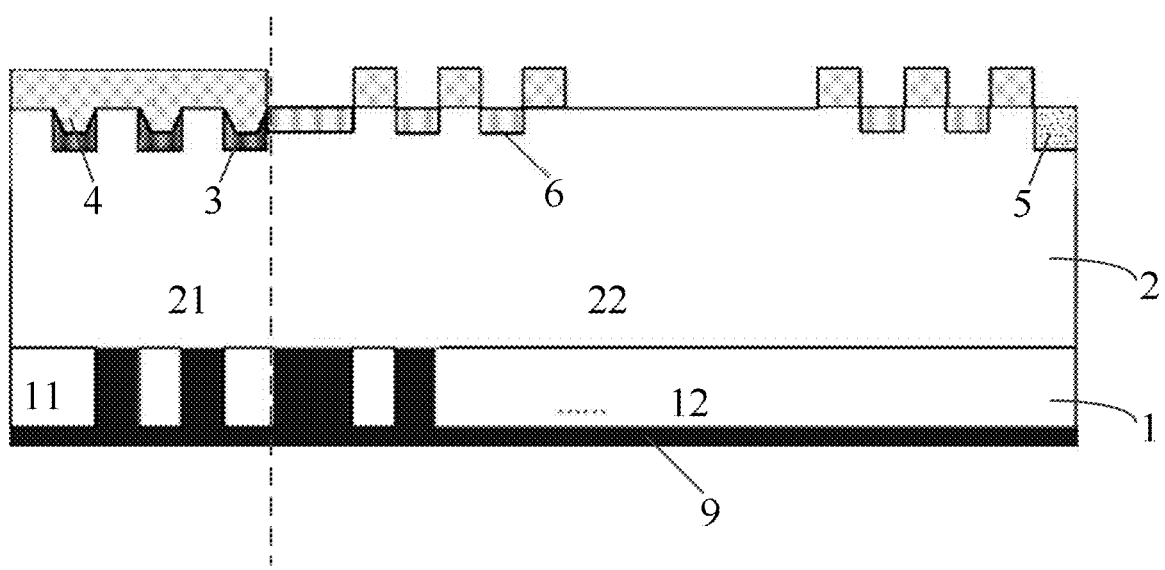

First, as shown in FIG. 1, an $N^+$ substrate 1 is provided; then, as shown in FIGS. 2-4, an $N^-$ epitaxial layer 2 is formed on the $N^+$ substrate 1 by, for example, a CVD process, wherein the $N^-$ epitaxial layer 2 includes an active area epitaxial layer 21 and a terminal area epitaxial layer 22, and a plurality of groove structures 4 are formed in the active area epitaxial layer 21; then, as shown in FIGS. 5-6, a plurality of $P^{++}$ area rings 3 are formed in the area of the active area epitaxial layer 21 below the plurality of groove structures 4, such that single $P^{++}$ area ring 3 is formed below single groove structure 4; then, as shown in FIGS. 7-8, an $N^+$ field stop ring 5 and a plurality of $P^+$ guard rings 6 are formed in the terminal area epitaxial layer 22; then, as shown in FIG. 9, a plurality of openings 13 opening toward the back surface are formed in the $N^+$ substrate 1; then, as shown in FIG. 10, ohmic contacts 9 are formed on the back surface of the $N^+$ substrate 1 and in the plurality of openings 13; finally, a passivation layer 8 is formed on the terminal area epitaxial layer 22, and a Schottky contact 7 is formed on the active area epitaxial layer 21. Thus, the preparation of the semiconductor device 100 is completed.

Specifically, the plurality of groove structures 4 may be formed by selective etching in the $N^-$ epitaxial layer 2, which specifically includes the following steps.

First, as shown in FIG. 3, a mask layer 10 is formed on the $N^-$ epitaxial layer 2. For example, the mask layer 10 may be deposited using a PECVD process, and the thickness of the mask layer 10 may be 20000 Å. The material of the mask layer 10 may be $SiO_2$, $Si_3N_4$, etc.

Then, a photoresist is spin-coated on the mask layer 10, and the mask layer 10 is patterned by photolithography and dry-etched to obtain a groove structure window. Then, a dry etching process is further used to form groove structures 4 shown in FIG. 4. The etching gas used may be one or more of HBr and $Cl_2$, and if necessary, $SF_6$, $O_2$ and other gases may be added.

Specifically, the plurality of $P^{++}$ area rings 3 may be formed by ion implantation, which specifically includes the following steps.

First, a mask layer 10 is formed on the $N^-$ epitaxial layer 2. For example, the mask layer 10 may be deposited using a PECVD process, and the thickness of the mask layer 10 may be 20000 Å.

Then, a photoresist is spin-coated on the mask layer 10, and the selective implantation window of the $P^{++}$ area ring 3 is formed by photolithography and dry etching technology.

Then, as shown in FIG. 5, in an environment with a temperature of 500° C., ion implantation of different energy and dose combinations is performed. The implanted ions may be Al ions, the implantation energy may be 50 kev-450 kev, and the total implantation dose may be $1\times10^{14}$ $cm^{-2}$~$1\times$ $10^{15}$ cm$^{-2}$, so that the doping concentration may be 2×10$^{19}$ cm$^{-3}$, and the implantation depth may be 0.5 µe;

After the ion implantation is completed, the mask layer 10 is removed, and activation annealing is performed to activate Al ions at the P$^{++}$ area ring 3. The activation annealing temperature may be 1700° C. and the time may be 30 min.

Specifically, an N$^+$ field stop ring 5 and a plurality of P$^+$ guard rings 6 may be formed on the terminal area epitaxial layer 22 by ion implantation, which specifically includes the following steps.

First, a mask layer 10 is formed on the N$^-$ epitaxial layer 2. For example, the mask layer 10 may be deposited using a PECVD process, and the thickness of the mask layer 10 may be 20000 Å.

Then, a photoresist is spin-coated on the mask layer 10, and selective injection windows of N$^+$ field stop ring 5 and the plurality of P$^+$ guard rings 6 are formed by photolithography and dry etching techniques.

Then, as shown in FIG. 7, the ion implantation of different energy and dose combinations is performed, and an N ion implantation is performed for the selective implantation window of the N$^+$ field stop ring 5, at a temperature of 200° C. to 500° C. and with an N ion energy of 40~550 kev and a total dose of implantation of 4×10$^{12}$~1×10$^{14}$ cm$^{-2}$. In an environment with a temperature of 500° C., a Al ion box-type implantation with different energy and dose combinations is performed. The implantation energy may be 50~450 kev, and the total implantation dose may be 1×10$^{14}$~8×10$^{14}$ cm$^{-2}$, and the doping concentration may be 8×10$^{18}$ cm$^{-3}$, and the implantation depth may be 0.5 µm.

After the ion implantation is completed, the mask layer 10 is removed, and high-temperature activation annealing after Al ion and N ion implantation is performed in an inert gas atmosphere. The activation annealing temperature may be 1300-1700° C.

Specifically, forming a plurality of openings 13 opening toward the back surface in the N$^+$ substrate 1 may include the following steps.

First, a mask layer 10 is formed on the N$^+$ substrate 1. For example, the mask layer 10 may be deposited using a PECVD process, and the thickness of the mask layer 10 may be 20000 Å.

Then, a photoresist is spin-coated on the mask layer 10, and the mask layer 10 is patterned by photolithography and dry-etched to obtain a plurality of windows of the openings 13. Then, a dry etching process is further used to form the plurality of openings 13 shown in FIG. 9, the depth of the openings may be 100 µm, and the etching gas used may be one or more of HBr and Cl$_2$, and if necessary, SF$_6$, O$_2$ and other gases may be added.

Specifically, forming an ohmic contact 9 on the back surface of the N$^+$ substrate 1 and in the plurality of openings 13 may include the following steps.

First, Ni metal is grown on the back surface of the N$^+$ substrate 1 and in the plurality of openings 13 by sputtering technology, and the thickness of the Ni metal may be 2000 Å.

Then, in a temperature range of 900 to 1000° C., rapid thermal annealing is performed in a vacuum environment or an inert gas atmosphere to form an ohmic contact 9; for example, rapid thermal annealing may be performed in a nitrogen atmosphere and at a temperature of 950° C. for 5 min to form ohmic contacts.

Further, it is also possible to re-grow a back thick metal, and the back thick metal may be Ni/Ag metal and electroplated Cu.

Specifically, forming the passivation layer 8 on the terminal area epitaxial layer 22 and forming the Schottky contact 7 on the active area epitaxial layer 21 may include the following steps.

First, a thermal oxidation process is used to grow 100 Å thick SiO$_2$ on the N$^-$ epitaxial layer 2, and then a PECVD process is used to deposit a mask layer 10 with a thickness of 6000 Å on the surface of the sample, and a photolithography is used to form the Schottky window, and the part outside the Schottky window remains as the passivation layer 8.

Then, Ti metal is grown in the Schottky window, the growth thickness may be 2000 Å and the Schottky contact 7 is formed using a low-temperature rapid thermal annealing process. The temperature of the annealing process may be 400-900° C., and the time may be 2-30 min. For example, rapid thermal annealing may be performed in a nitrogen atmosphere and at a temperature of 500° C. for 5 min to form a Schottky contact 7.

Further, a metal evaporation process may also be used to grow a 4 µm thick packaging thick metal Al; in other embodiments, the Schottky contact 7 and the packaging thick metal may both be Al metal.

The Schottky contact 7 is formed by a low temperature annealing process as described above. In this way, the contact between the Schottky metal and the semiconductor (for example, SiC) is between the Schottky contact and the ohmic contact, and becomes Schottky-like contact tending to the Schottky contact. The Schottky-like contact may greatly improve the forward conduction capability; and due to the existence of the groove structures, the surface electric field of the device may be greatly reduced, and the reverse blocking capability of the device may also be guaranteed.

Figure 12:
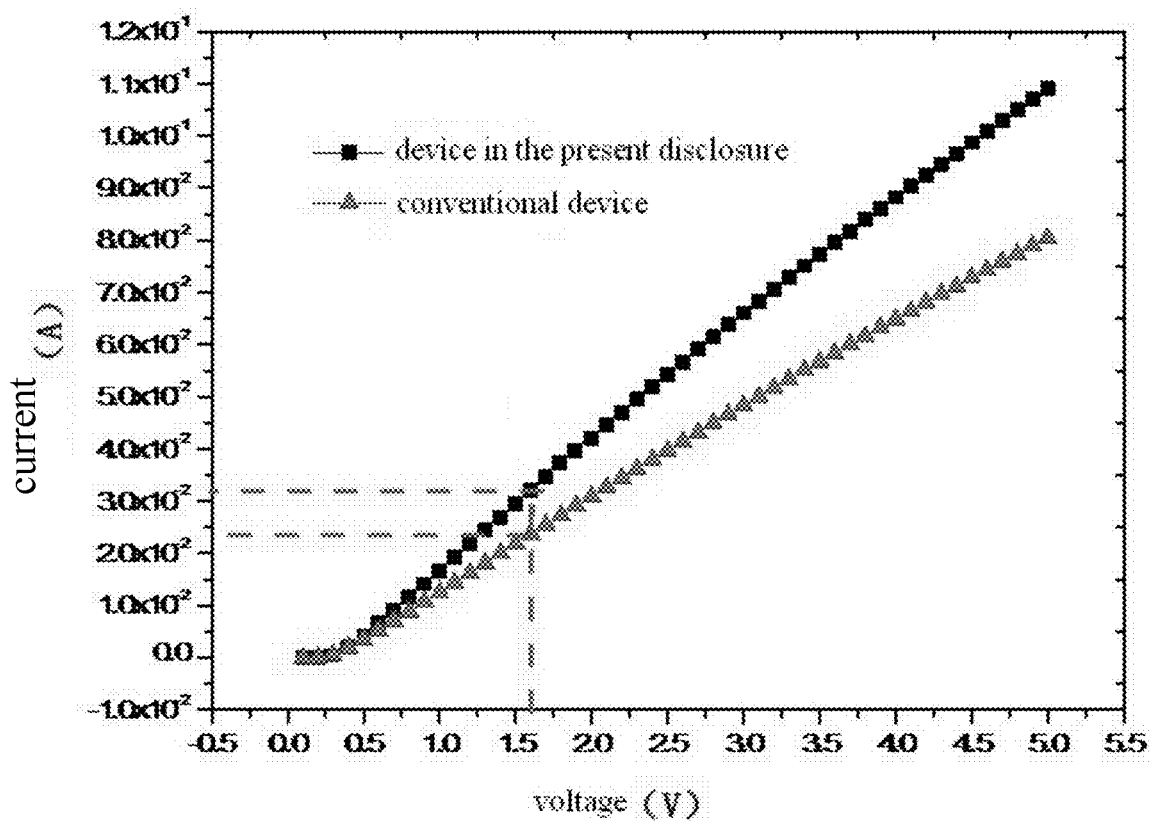
FIG. 12 shows a static simulation forward I-V characteristic diagram of a semiconductor device according to an exemplary embodiment of the present disclosure.
Figure 13:
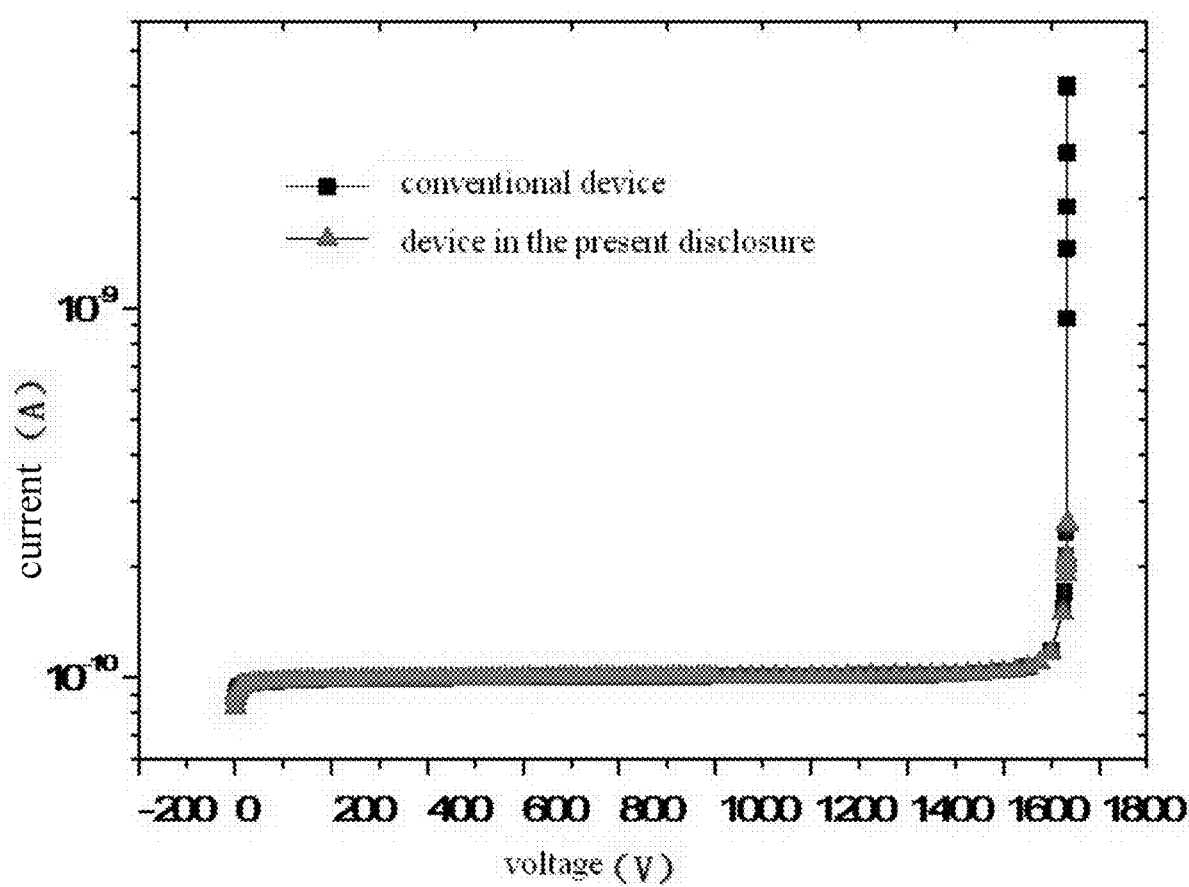
FIG. 13 shows a static simulation reverse I-V characteristic diagram of a semiconductor device according to an exemplary embodiment of the present disclosure.

FIG. 12 shows a static simulation forward I-V characteristic diagram of a semiconductor device 100 according to an exemplary embodiment of the present disclosure. As shown in FIG. 12, when the forward voltage is 1.6V, the forward on-current of the semiconductor device 100 adopting the structure of the present disclosure is increased by about 35% compared with the conventional device, thereby greatly improving the forward conduction capability. FIG. 13 shows a static simulation reverse I-V characteristic diagram of a semiconductor device 100 according to an exemplary embodiment of the present disclosure. As shown in FIG. 13, the reverse cut-off current of the semiconductor device 100 is significantly smaller than that of a conventional device, and the leakage current is small. And thus the reverse blocking capability is improved compared with conventional devices.

Although the present disclosure has been described with reference to the accompanying drawings, the embodiments disclosed in the accompanying drawings are intended to exemplify the implementation of the present disclosure and should not be understood as a limitation of the present disclosure.

Those of ordinary skill in the art will understand that changes may be made to these embodiments without departing from the principle and spirit of the general concept of the present disclosure, and the scope of the present disclosure shall be defined by the claims and their equivalents.

What is claimed is:

1. A semiconductor device, comprising:
   an N$^+$ substrate, in which a plurality of openings that open toward a back surface are formed;
   an N$^-$ epitaxial layer on the N$^+$ substrate, the N$^-$ epitaxial layer comprising an active area epitaxial layer and a terminal area epitaxial layer;
   a Schottky contact on the active area epitaxial layer;
   a passivation layer on the terminal area epitaxial layer; and
   ohmic contacts on the back surface of the N$^+$ substrate and in the plurality of openings,
   wherein the active area epitaxial layer comprises a plurality of P$^{++}$ area rings and a plurality of groove structures, a single groove structure is formed on a single $P^{++}$ area ring, and the terminal area epitaxial layer comprises an $N^+$ field stop ring and a plurality of $P^+$ guard rings, wherein the $N^+$ substrate comprises an active area substrate and a terminal area substrate, and the plurality of openings are formed in both the active area substrate and the terminal area substrate, and wherein the openings in the terminal area substrate are arranged corresponding to the $P^+$ guard rings.

2. The semiconductor device according to claim 1, wherein the openings in the active area substrate and the groove structures are arranged in a staggered arrangement.

3. The semiconductor device according to claim 1, wherein the depth of each of the openings is greater than, equal to, or less than the thickness of the $N^+$ substrate.

4. The semiconductor device according to claim 1, wherein single groove structure has a width of 1-8 μm, a depth of 0.5-1 μm, and a spacing between adjacent groove structures is in a range of 1-10 μm.

5. The semiconductor device according to claim 1, wherein single $P^+$ guard ring has a width of 1-5 μm, a depth of 0.5-1 μm, and a spacing between adjacent $P^+$ guard rings is in a range of 1-5 μm.

6. The semiconductor device according to claim 1, wherein the material of the Schottky contact comprises Mo, Al or a metal having a lower barrier than Mo and Al.

7. The semiconductor device according to claim 1, wherein the semiconductor device comprises a SiC trench device.

8. A method of preparing a semiconductor device, comprising:
providing an $N^+$ substrate;
forming an $N^-$ epitaxial layer on the $N^+$ substrate, wherein the $N^-$ epitaxial layer comprises an active area epitaxial layer and a terminal area epitaxial layer, and a plurality of groove structures are formed in the active area epitaxial layer;

forming a plurality of $P^{++}$ area rings in an area of the active area epitaxial layer below the plurality of groove structures, so that single $P^{++}$ area ring is formed below single groove structure;

forming an $N^+$ field stop ring and a plurality of $P^+$ guard rings on the terminal area epitaxial layer;

forming a plurality of openings that open toward a back surface in the $N^+$ substrate;

forming ohmic contacts on the back surface of the $N^+$ substrate and in the plurality of openings; and forming a passivation layer on the terminal area epitaxial layer, and forming a Schottky contact on the active area epitaxial layer, wherein the $N^+$ substrate comprises an active area substrate and a terminal area substrate, and the plurality of openings are formed in both the active area substrate and the terminal area substrate, and wherein the openings in the terminal area substrate are arranged corresponding to the $P^+$ guard rings.

9. The method according to claim 8, wherein positions of the openings in the active area substrate are determined by the groove structures.

10. The method according to claim 8, wherein positions of the openings in the terminal area substrate are determined by the $P^+$ guard rings.

11. The method according to claim 8, wherein the Schottky contact is formed by a thermal annealing process, and the temperature of the thermal annealing process is 400-900° C. and the time of the thermal annealing process is 2-30 min.

* * * * *